US006686211B1

(12) United States Patent
Asakawa

(10) Patent No.: US 6,686,211 B1
(45) Date of Patent: Feb. 3, 2004

(54) METHOD FOR MANUFACTURING NON-VOLATILE MEMORY DEVICE AND NON-VOLATILE MEMORY AND SEMICONDUCTOR DEVICE

(75) Inventor: Tsutomu Asakawa, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/695,565

(22) Filed: Oct. 24, 2000

(30) Foreign Application Priority Data

Oct. 25, 1999 (JP) .......................................... 11-302820

(51) Int. Cl.[7] ............................................... H01L 21/00
(52) U.S. Cl. .............................. 438/3; 438/99; 438/396
(58) Field of Search .............................. 438/3, 99, 396, 438/399; 257/303, 306, 686; 365/145

(56) References Cited

U.S. PATENT DOCUMENTS

| 4,860,254 A | * | 8/1989 | Pott et al. ..................... 365/145 |
| 5,416,042 A |   | 5/1995 | Beach et al. ................... 437/60 |
| 6,087,196 A | * | 7/2000 | Sturm et al. ................... 438/29 |
| 6,198,151 B1 | * | 3/2001 | Wada ........................... 257/520 |
| 6,335,206 B1 |   | 1/2002 | Nishimura ..................... 438/3 |

FOREIGN PATENT DOCUMENTS

| JP | 7335840 |   | 12/1995 |
| JP | 115474 | * | 2/1999 |
| JP | 11214626 |   | 8/1999 |
| WO | 9912170 |   | 3/1999 |
| WO | 9938203 |   | 7/1999 |

OTHER PUBLICATIONS

Yamauchi N., "A Metal–Insulator–Semiconductor (MIS) Device Using a Ferroelectric Polymer Thin Film in the Gate Insulator", Jap. J. Appl. Phys., vol. 25(4), p. 590–594(1986).*

Date et al., "Opto–Ferroelectric memeories Using Vinylidene Fluoride", IEEE Trans. Electr. Insul., vol. 24(3) p. 537–540 (1989).*

Date M., "Ferroelectric Optical memory", Plast. Eng., vol. 28, p. 771–789 (1995).*

Hayes et al., "Micro–Jet printing of Polymers for Electronics manufacturing", Proc. Intl. Conf. Adhes. Joining Coat. Technology, Electron. Manuf., p. 168–173, IEEE, N. Y., 1998.*

Bao et al., "Printable Organic and Polymeric Semiconducting Materials and Devices", J. master. Chem., vol. 9, p. 1895–1904 (1999).*

Melnick et al., "Recent Results on Switching, Fatigue and Electrical Characterization of Sol–Gei Based PZT Capacitors," Ferroelectrics, 1991, vol. 116, pp. 79–93.

* cited by examiner

Primary Examiner—Kamand Cuneo
Assistant Examiner—Asok Kumar Sarkar
(74) Attorney, Agent, or Firm—Konrad Raynes Victor & Mann, LLP; Alan S. Raynes

(57) ABSTRACT

When a non-volatile memory cell is manufactured, in order to make a semiconductor process for forming a cell transistor to conform to a ferroelectric process for forming a ferroelectric capacitor, in accordance with the present invention, when a non-volatile memory device having a ferroelectric capacitor 18 that is formed from an organic thin film 8 capable of a polarization inversion by an external electric field and provided between a lower electrode 7 and an upper electrode 9, a material solution 80 for the organic thin film 8 is coated over the lower electrode 7 using an ink jet type recording head 15, and is solidified by a heat treatment or the like to thereby form the organic thin film 8. By the manufacturing method, the film forming temperature of the organic thin film 8 becomes to be lower than 150° C.~200° C., and therefore damages are not inflicted on the cell transistor 17, and a ferroelectric process that conforms to a semiconductor process is provided.

36 Claims, 8 Drawing Sheets

(A)

(B)

(C)

ed thereby, and more particularly to an improved tech-
nique of a ferroelectric process.

METHOD FOR MANUFACTURING NON-VOLATILE MEMORY DEVICE AND NON-VOLATILE MEMORY AND SEMICONDUCTOR DEVICE

TECHNICAL FIELD

The present invention relates to a technique for manufacturing non-volatile memory devices and non-volatile memory devices and semiconductor apparatuses manufactured thereby, and more particularly to an improved technique of a ferroelectric process.

TECHNICAL BACKGROUND

FIG. 8 shows a cross-sectional structure of a 1T1C (1 transistor+1 capacitor) type non-volatile ferroelectric memory device with a stacked type cell structure. Referring to the figure, a semiconductor substrate 1 is formed with a cell transistor 17 that is mainly composed of a gate electrode 2, a source region 3 and a drain region 4, and a device element isolation insulation film 5. The cell transistor 17 that forms each memory cell is connected to a ferroelectric capacitor 18 through an interlayer insulation film 6. The ferroelectric capacitor 18 is composed of a lower electrode 7, a ferroelectric film 19 and an upper electrode 9, wherein the ferroelectric film 19 is formed from a PZT ferroelectric material, a SBT ferroelectric material or the like. The lower electrode 7 connects to the drain region 4 through a contact hole that is opened in the interlayer insulation film 6, and the upper electrode 9 connects to a plate line 20 through a contact hole that is opened in an interlayer insulation film 21. Also, the gate electrode 2 connects to a word line, and the source region 3 connects to a bit line.

When the non-volatile ferroelectric memory device having the structure describe above is manufactured, for example, as described in Japanese laid-open patent application HEI 7-335840 and Japanese laid-open patent application HEI 11-214626, the cell transistor 17 is formed on the semiconductor substrate 1 using a semiconductor process, and then the ferroelectric capacitor 18 to be connected to the cell transistor 17 is formed using a ferroelectric process such as the Sol-Gel method. A film forming method for the ferroelectric film 19 using the Sol-Gel method is described in detail in *Ferroelectrics*, Voll. 116, pp79–93 "Recent Result on Switching, Fatigue and Electrical Characterization of Sol-Gel based PZT Capacitors".

It is noted that, in the present specification, a ferroelectric process refers to a process for forming a capacitor insulation film composed of, for example, a PZT or SBT ferroelectric material and the like that is used for a ferroelectric capacitor, as well as a film such as an organic thin film that can undergo a polarization inversion by an external electric field.

However, when the non-volatile ferroelectric memory device having a multiple-layered structure is manufactured by the above-described method, the cell transistor 17 is formed in a lower layer, and then the ferroelectric capacitor 18 is formed above in an upper layer. Accordingly, a problem has been pointed out that the ferroelectric film 19 that is formed from an oxide develops an oxygen deficiency by a reducing atmosphere, and therefore deterioration of its characteristics occurs.

The characteristic deterioration due to the oxygen deficiency of the ferroelectric capacitor 18 can be restored by a heat treatment conducted under an oxygen atmosphere at temperatures of 550° C.~600° C. However, a heat treatment cannot be conducted after a process of wiring a low melting-point metal such as aluminum. Furthermore, although PZT based materials are often used for ferroelectric films, non-volatile memory devices may preferably be manufactured with a material that does not contain zinc, in consideration of the pollution of the process line by diffusion of zinc in the manufacturing process.

Accordingly, it is an object of the present invention to provide a method for manufacturing a non-volatile memory device with a ferroelectric process that conforms with a semiconductor process for forming cell transistors.

DESCRIPTION OF THE INVENTION

To solve the problems described above, in accordance with the present invention, when a non-volatile memory device having a ferroelectric capacitor that is formed from an organic thin film capable of a polarization inversion by an external electric field provided between a lower electrode and an upper electrode is manufactured, a material solution for the organic thin film is coated on the lower electrode, and is solidified to thereby form an organic thin film. According to this method, the film forming temperature of the organic thin film becomes to be lower than 150° C.~200° C., which does not cause damages to cell transistors, and therefore a ferroelectric process that conforms with a semiconductor process is provided.

The material solution for the organic thin film may preferably include, for example, a material solution containing a copolymer of vinylidene fluoride and trifluoroethylene dissolved in a solvent. An ink jet type recording head may be used to coat the material solution for the organic thin film on the lower electrode, with the result that a highly accurate patterning can be performed.

Also, in accordance with the present invention, a material solution that contains fine particles of the upper electrode may be coated on the organic thin film and solidified to thereby form an upper electrode. In this case, an ink jet type recording head may be used to coat the material solution for the upper electrode, with the result that patterning and film formation of the upper electrode can be simultaneously conducted with a high level of precision.

Also, in accordance with the present invention, partitioning members to partition lower electrodes provided in respective memory cells may be formed, and the material solution for the organic thin film may be filled over the lower electrodes that are partitioned by the partitioning members and solidified to thereby form the organic thin film. In accordance with this method, cross talks between the memory cells accompanied with a higher integration of memory devices can be prevented.

In the manufacturing method described above, an upper layer of the partitioning member may preferably be formed with a material that does not have an affinity for the material solution for the organic thin film. By such a structure, the material solution for the organic thin film can be readily coated. The material with non-affinity may preferably include, for example, polyimide, amorphous silicon, poly-silicon or an organic compound including fluorine.

Figure 1:
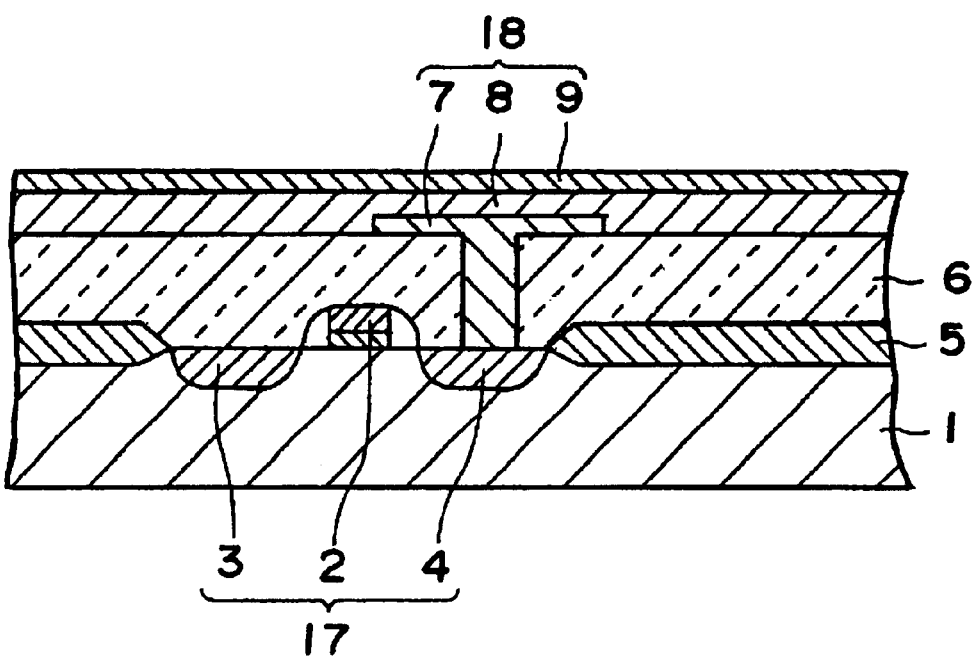
FIG. 1 shows a cross-sectional view of a non-volatile memory device in accordance with a first embodiment of the present invention.

1 . . . Semiconductor substrate
17 . . . Cell transistor
7 . . . Lower electrode
8 . . . Organic thin film
9 . . . Upper electrode
10 . . . Memory cell array
15 . . . Ink jet type recording head
18 . . . Ferroelectric capacitor

BEST MODE EMBODIMENT OF THE PRESENT INVENTION

First Embodiment of the Present Invention

Hereunder, an embodiment of the present invention is described with reference to FIGS. 1 through 3.

FIG. 1 shows a cell cross-sectional structure of a non-volatile memory device in accordance with the present embodiment. The non-volatile memory device shown in the figure has a stacked type cell structure, in which a cell transistor 17 formed from a gate electrode 2, a source region 3 and a drain region 4 and an element isolation insulation film 5 are formed over a semiconductor substrate 1, and a ferroelectric capacitor 18 is formed above in an upper layer through an interlayer insulation film 6. The ferroelectric capacitor 18 is composed of a lower electrode 7, an organic thin film 8 and an upper electrode 9. The organic thin film 8 is formed from an organic material having a spontaneous polarization, and can undergo a polarization inversion in response to a voltage applied to the organic thin film 8 by the upper electrode 9 and the lower electrode 7. By utilizing the polarization characteristic, data reading/writing can be conducted.

A copolymer of vinylidene fluoride and trifluoroethylene, described in PCT publication WO99/12170, for example, can be used as an organic material that forms the organic thin film 8. The mixing ratio of the two may be changed to adjust the characteristic of the organic thin film 8, and the above-described copolymer has a smaller anti-electric field than a polymer of vinylidene fluoride and a more squared hysteresis loop.

Figure 2:
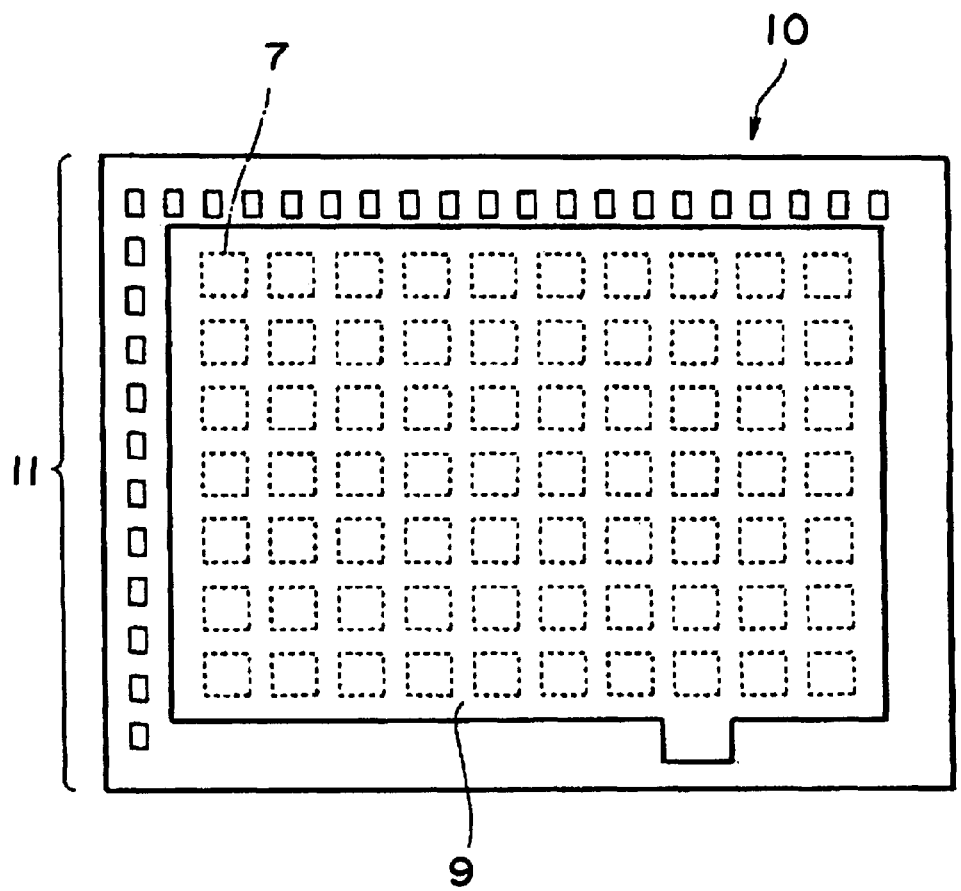
FIG. 2 shows a plan view of the non-volatile memory device in accordance with the first embodiment of the present invention.
Figure 3:
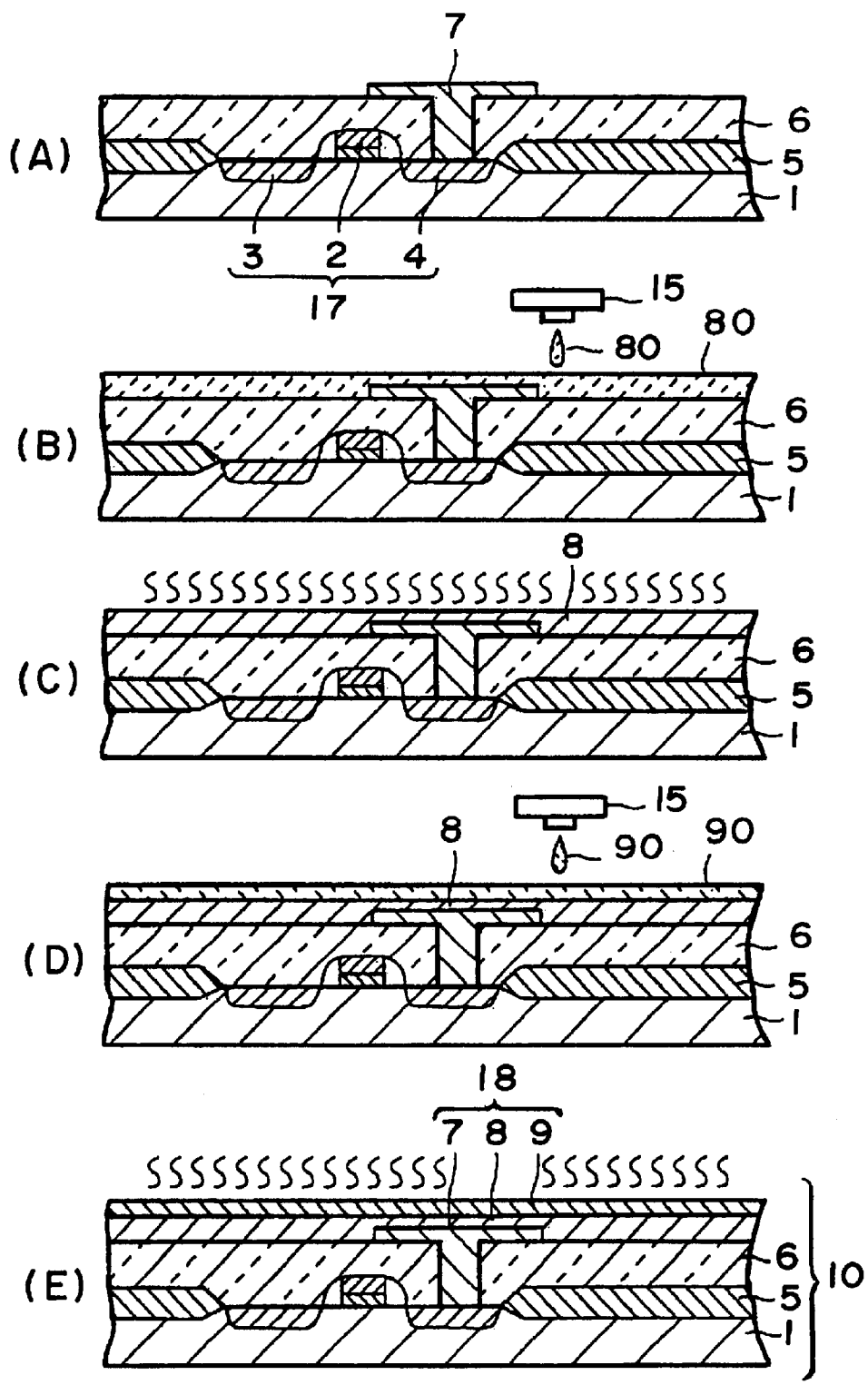
FIG. 3 shows cross-sectional views of the non-volatile memory device in a manufacturing process in accordance with the first embodiment of the present invention.

FIG. 2 shows a plan view of the non-volatile memory device described above. A memory cell array 10 has a plurality of the lower electrodes 7 disposed in an array form in a specified region (a memory cell assembly section) that are etched in a specified configuration. Also, an upper electrode 9 is formed in a manner to cover the plurality of the lower electrodes 7 across the entire surface of the memory cell assembly section. In this structure, the upper electrode 9 plays a role of an electrode (a common electrode) commonly shared by all of the memory cells.

Also, a variety of connection terminals 11 such as address terminals for peripheral circuits such as drivers to access respective memory cells, data input/output terminals and the like are provided in a peripheral section of the memory cell array 10.

Embodiment

Next, a process of manufacturing a non-volatile memory device is described with reference to FIG. 3. As shown in (A) of the same figure, by utilizing a known semiconductor process, a silicon oxide film is formed over a semiconductor substrate 1, impurity ions are implanted, and a polycrystal silicon film containing phosphorous is formed and patterned to thereby form a gate electrode 2, a source region 3, a drain region 4 and the like to form a cell transistor 17, an element isolation insulation film 5 and an interlayer insulation film 6. Furthermore, contact holes that communicate with the drain region 4 are opened in the interlayer insulation film 6, and an aluminum film is formed by a sputtering method over the interlayer insulation film 6 and thereafter patterned in an array configuration to form a plurality of lower electrodes 7 in a memory cell assembly section.

Then, organic materials having the above-described spontaneous polarization are dissolved in a specified solvent to make an organic thin film material solution 80, which is then coated over the entire surface of the memory cell assembly section over the lower electrodes 7 by using an ink jet type recording head 15 ((B) of the same figure). The organic thin film material solution 80 acts as a precursor material to obtain an organic thin film 8 in succeeding steps. A solvent to dissolve the organic materials includes PGMEA, cyclohexane, carbitol acetate and the like. Glycerin, diethylene glycol, ethylene glycol and the like may be added as a wetting agent or a binder as required. To eject the organic thin film material solution 80 through the ink jet type recording head 15, its viscosity may preferably be lower than several centipoise and its surface tension is in a range between 20 dyn/cm~70 dyn/cm.

Since an area to be coated with the organic thin film material solution 80, in other words, an area of the memory cell assembly section, is greater than an area occupied by each memory cell, patterning and coating thereof by an ink jet type recording head are possible. By the patterning process that is conducted with the ink jet type recording head, the organic thin film material precursor material 80 can be coated at any specified location and with any specified thickness on a pattern forming surface with a low cost facility. The ink jet type recording head can be of a piezo-jet type in which required fluid is ejected by changing the volume of a piezoelectric element, or of a bubble jet type in which required fluid is ejected by rapidly generating vapor by an application of heat. The organic thin film material solution 80 is coated on the respective lower electrodes 7 that are disposed in an array, and then is dried by a heat treatment at temperatures of 150° C.~200° C. As a result of this treatment, the solvent composition of the organic thin film material solution 80 evaporates and solidifies to become an organic thin film 8 ((C) of the same figure).

Then, fine particles of metal that composes an upper electrode, such as, for example, fine particles of aluminum are dissolved in an appropriate solvent to make an upper electrode material solution 90, which is coated over the organic thin film 8 using the ink jet type recording head 15

((D) of the same figure). The upper electrode material solution 90 acts as a precursor material to form an upper electrode 9 in succeeding steps. A solvent to dissolve the aluminum particles includes butyl carbitol acetate, 3-dimethyl-2-imidazolyzen, BMA and the like. Then, the upper electrode material solution 90 coated over the organic thin film 8 is heat-treated to evaporate the solvent composition to thereby form the upper electrode 9 ((E) of the same figure).

It is noted that a metal that composes the upper electrode 9 includes, in addition to aluminum, $RuO_2$, Pt, $IrO_2$, $OsO_2$, $MoO_2$, $ReO_2$, $WO_2$, $YBa_2Cu_3O_7$-X, Au, Ag, In, In—Ga alloy, Ga, solder and the like.

The connecting terminals 11 of the memory cell array 10 obtained in the above-described manufacturing process are connected to peripheral circuits such as drivers, and further sealed by a resin to complete a non-volatile memory device.

In accordance with the manufacturing method described above, since the organic thin film 8 can be formed and patterned by the ink jet type recording head 15, the film forming temperature of the organic thin film 8 can be set at lower than 150° C.~200° C. Therefore, damages that may be inflicted on the cell transistor 17 can be substantially suppressed, compared to the conventional manufacturing method in which a ferroelectric capacitor 18 is formed by the Sol-Gel method that requires a heat treatment at temperatures above 650° C. As a result, since the patterning process for the organic thin film 8 by the ink jet type recording head 15 conforms with the semiconductor process for forming the cell transistor, the problems of the conventional technique described above can be solved.

Also, in the ferroelectric process using the conventional Sol-Gel method, a process for patterning a ferroelectric film 19 by a lithography method is required. However, in accordance with the present manufacturing method, the organic thin film 8 can be coated and patterned by the ink jet type recording head 15, and therefore, a lithography process can be omitted. As a result, the manufacturing process can be simplified.

Also, in the conventional lithography process, steps of coating, exposing and developing a resist are required, such that a large facility investment and a great maintenance cost are required. Furthermore, since the material once coated is removed in an etching step, there is a problem in that a large amount of the material is wasted. However, in accordance with the present manufacturing method, since the film formation and patterning of the organic thin film 8 can be simultaneously conducted by the ink jet type recording head 15, a large-scale facility such as a factory may not be required, and the manufacturing cost can be substantially lowered because the waste of the material does not occur.

Also, since the resolution of the ink jet type recording head 15 is very fine, for example, at 400 dpi, any desired patterning and coating can be conducted with a precision on the order of $\mu$m. Therefore, minute patterning of the organic thin film 8 is possible, which accommodates a higher integration of memory devices.

It is noted that, in accordance with the embodiment of the present invention, in addition to the ink jet type recording head 15 that is used as a means to coat the organic thin film material solution 80, a variety of printing methods, a spin-coating method, a spray-coating method and the like can also be used.

Also, when compared with the conventional technique in which a PZT based material is used for the ferroelectric film 19, the organic thin film 8 does not contain zinc, and therefore, pollution of the manufacturing process line by diffusion of zinc can be prevented.

Second Embodiment of the Present Invention

Hereunder, an embodiment of the present invention will be described with reference to FIGS. 4 through 7.

Figure 4:
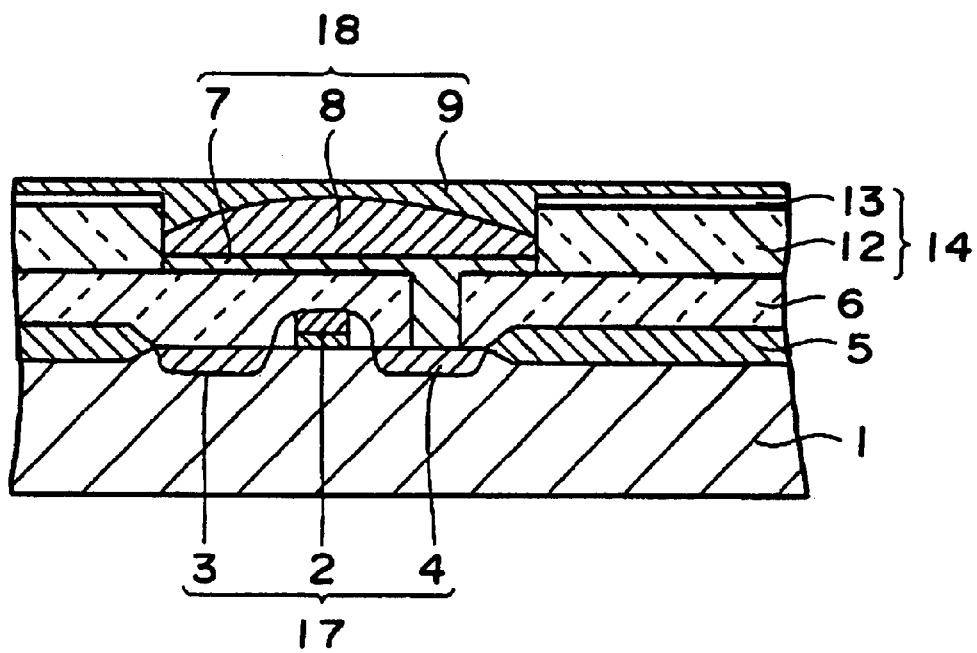
FIG. 4 shows a cross-sectional view of a non-volatile memory device in accordance with a second embodiment of the present invention.

FIG. 4 shows a cell cross-sectional structure of a non-volatile memory device in accordance with the present embodiment. The non-volatile memory device shown in the figure has a structure basically similar to that of the first embodiment. Accordingly, the same elements are denoted by the same reference numbers, and their detailed description is omitted.

The non-volatile memory device of the present embodiment is different from the first embodiment in that partitioning members 14 are formed to mutually partition ferroelectric capacitors 18 formed in respective memory cells one from the other. The partitioning members 14 are provided to prevent cross talks between the memory cells, which accompany with a higher integration of memory devices.

The partitioning member 14 has a two-layer structure having an interlayer insulation film 12 and a repelling liquid layer 13 disposed thereon. The repelling liquid layer 13 is a thin film that has a property of a large contact angle with respect to the organic thin film material solution 80, and has a non-affinity for the organic thin film material solution 80. Since an upper layer of the partitioning member 14 is formed with a material that has a non-affinity for the organic thin film material solution 80, when the organic thin film material solution 80 is filled in a recessed portion defined by the partitioning members, it is prevented from leaking from the recessed portion to adjacent recessed portions. The repelling liquid layer 13 may preferably be formed from a material, such as, for example, polyimide, amorphous silicon, polysilicon, and an organic compound including fluorine. Also, when a silicon oxide film or a silicon nitride film is used as the interlayer insulation film 12, because these materials have an affinity for the organic thin film material solution 80, the organic thin film material solution 80 can be filled well in a recessed portion defined by the partitioning members 14. Also, when the lower electrode 7 is formed from aluminum, since the organic thin film material solution 80 has an affinity for the lower electrode 7, it can fill the recessed portions much better.

Figure 5:
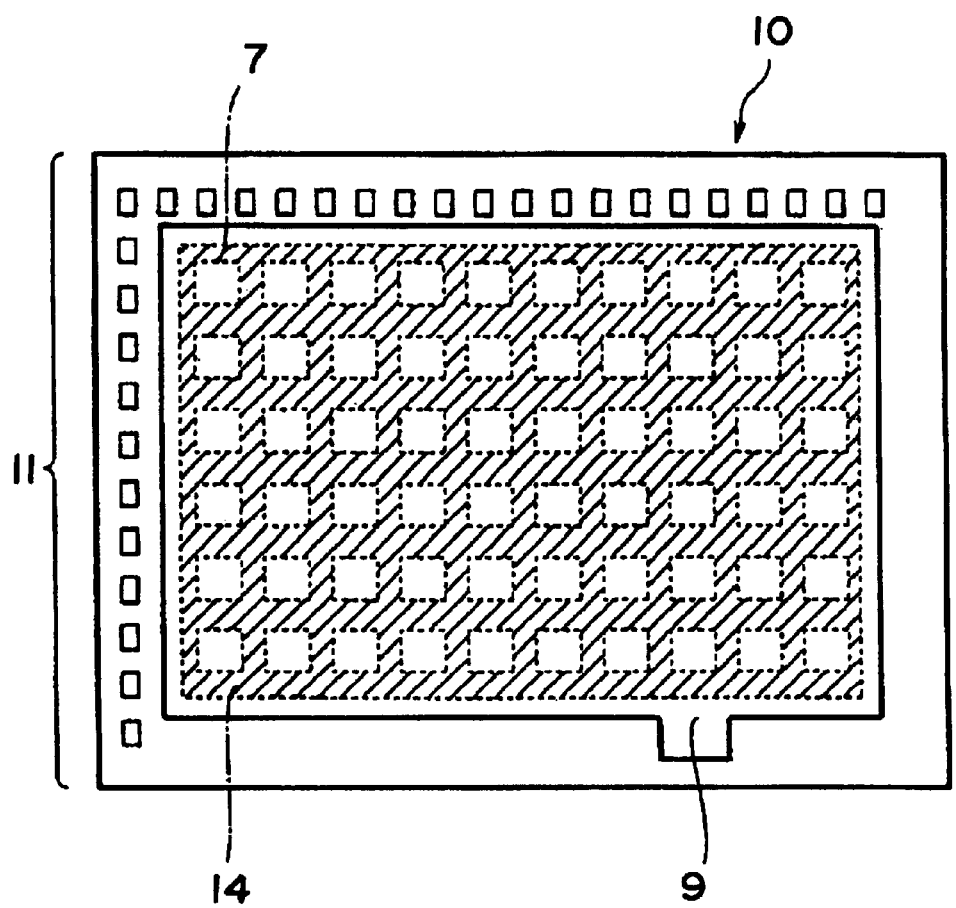
FIG. 5 shows a plan view of the non-volatile memory device in accordance with the second embodiment of the present invention.

FIG. 5 shows a plan view of the above-described non-volatile memory device. The plurality of lower electrodes 7 that are partitioned in an array configuration by the partitioning members 14 are disposed in a specified region (a memory assembly section) of the memory cell array 10. An upper electrode 9 is formed in a manner to cover the lower electrodes 7 across the entire surface of the memory cell assembly section. In this structure, the upper electrode 9 plays a role of an electrode (common electrode) commonly shared by all of the memory cells. Also, a variety of connection terminals 11 such as address terminals for peripheral circuits including drivers and the like to access the respective memory cells, data input/output terminals and the like are formed in a peripheral section of the memory cell array 10.

Embodiment

Figure 6:
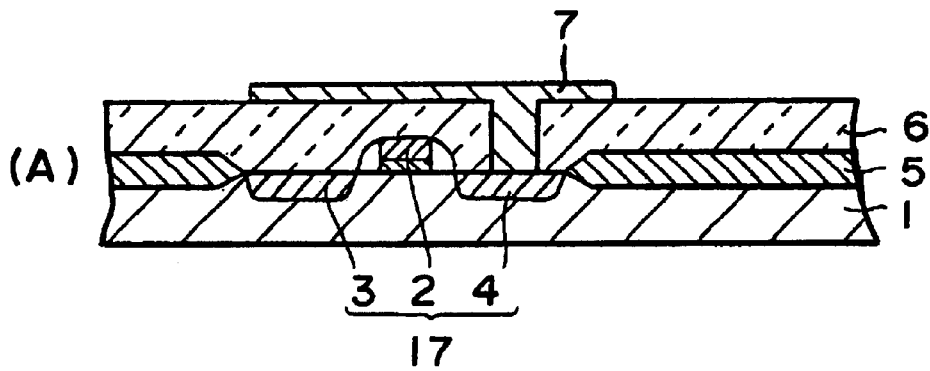
FIG. 6 shows cross-sectional views of the non-volatile memory device in a manufacturing process in accordance with the second embodiment of the present invention.
Figure 6:
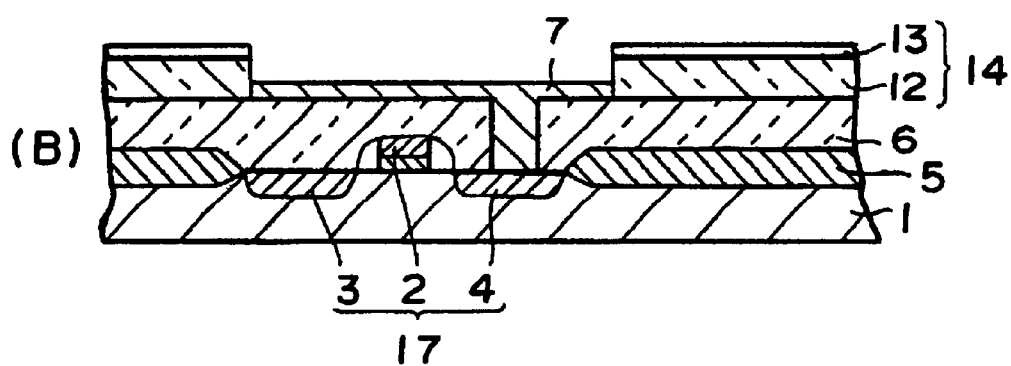
Figure 6:
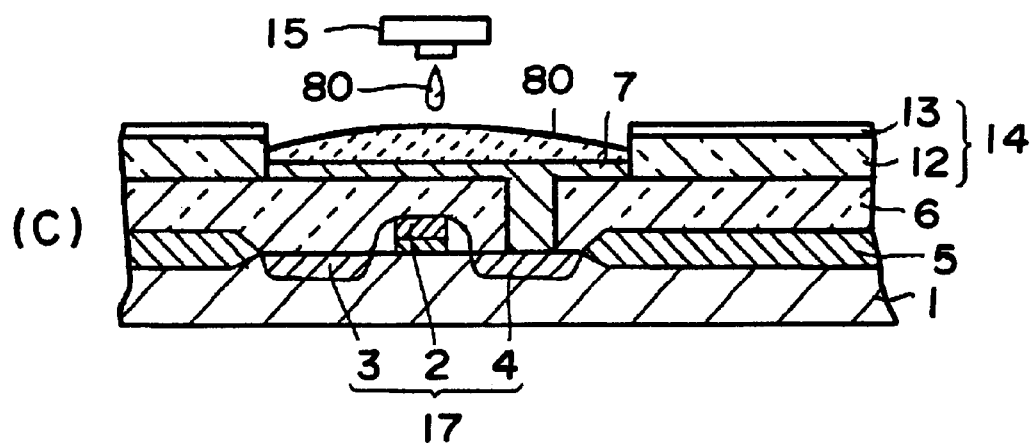
Figure 7:
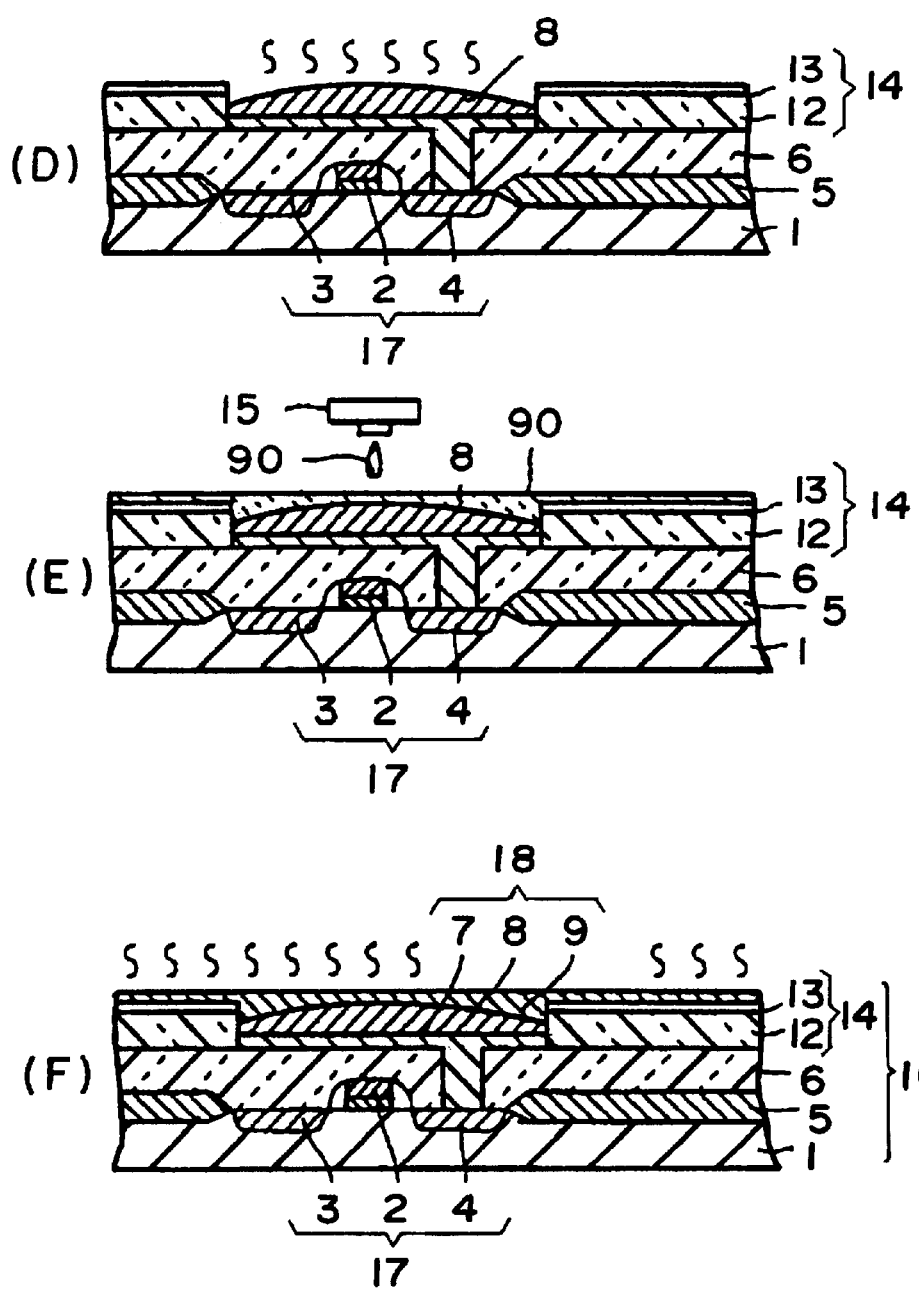
FIG. 7 shows cross-sectional views of the non-volatile memory device in a manufacturing process in accordance with the second embodiment of the present invention.
Figure 8:
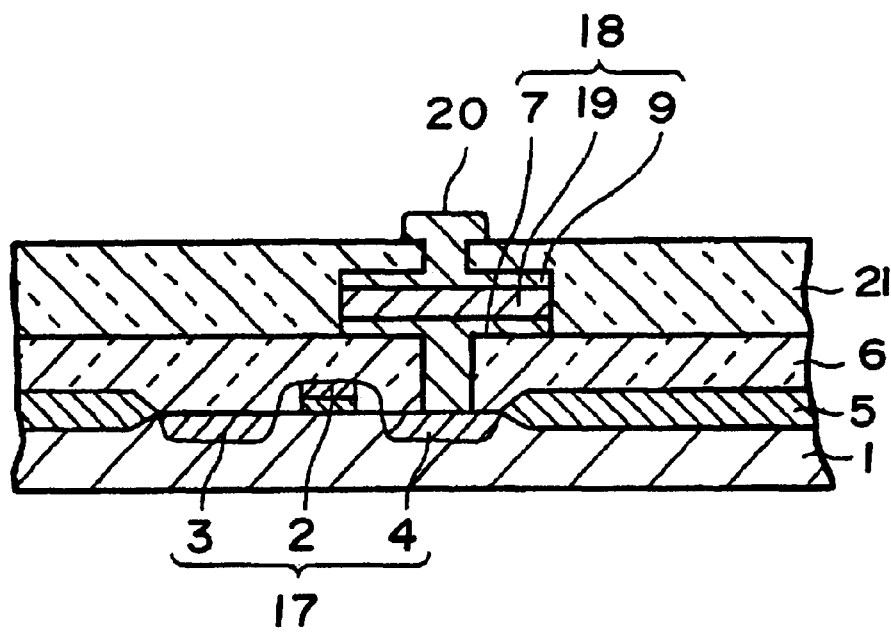
FIG. 8 shows a cross-sectional view of a conventional non-volatile memory device.

Next, a process of manufacturing a non-volatile memory device is described with reference to FIG. 6 and FIG. 7. As shown in FIG. 6(A), by utilizing a known semiconductor process, a gate electrode 2, a source region 3, a drain region 4 and the like are formed over a semiconductor substrate 1 to form a cell transistor 17, and an element isolation insulation film 5 and an interlayer insulation film 6 are formed. Furthermore, contact holes that communicate with the drain region 4 are opened in the interlayer insulation film 6, and an aluminum film is formed by a sputtering method over the interlayer insulation film 6 and thereafter is patterned in an array configuration to form lower electrodes 7.

Then, an interlayer insulation film 12 and a repelling liquid layer 13 are successively deposited over the interlayer insulation film 6 including the lower electrodes 7, and portions corresponding to the lower electrodes 7 are selectively etched to expose surfaces of the lower electrodes 7 ((B) of the same figure). By this process, partitioning members 14 are formed in a memory cell assembly section. For example, when a silicon oxide film is formed as the interlayer insulation film 12, such a film can be formed by a plasma CVD method using an organic silane (TEOS) and oxygen as reactive gases, and when a silicon nitride film is formed, such a film can be formed by a plasma CVD method using a silane based gas and nitrogen as reactive gases.

When polyimide is formed in a film for the repelling liquid layer 13, an appropriate method such as a lithography method, a printing method or the like can be selected. When a lithography method is used, an organic material may be coated by an appropriate method such as a spin coating, spray coating, roll coating, dye coating, dip coating or the like.

Subsequently, an organic thin film material solution 80 is filled over the lower electrodes 7 that are partitioned by the partitioning members 14 ((C) of the same figure), and heat-treated to evaporate a solvent composition thereof to form an organic thin film 8 (FIG. 7(D)). The organic thin film material solution 80 is filled by coating each of the memory cells in an amount that does not flow over the partition members 14. Then, an upper electrode material solution 90 is coated over each of the memory cells ((E) of the same figure), and heat-treated to evaporate a solvent composition thereof to form an upper electrode 9 ((F) of the same figure). By conducting the steps described above, a memory cell array 10 is formed.

In accordance with the manufacturing method described above, the partition members 14 are provided to partition the memory cells, such that cross talks between the adjacent memory cells, which accompany with a higher memory device integration, can be effectively prevented. Therefore, higher memory device integration becomes possible. Also, since the repelling liquid layer 13 is formed in an upper layer of the partitioning member 14, the organic thin film material solution 80 can be readily filled over the lower electrodes 7 that are partitioned by the partitioning members 14.

INDUSTRIAL USABILITY

In accordance with the present invention, the film forming temperature for an organic thin film having a spontaneous polarization can be set below 150° C.~200° C. Therefore, damages that may be inflicted on the cell transistor can be substantially suppressed, compared to the conventional manufacturing method in which a ferroelectric capacitor is formed by the Sol-Gel method that requires a heat treatment at temperatures above 650° C. As a result, the ferroelectric process of the present invention conforms to a semiconductor process for forming cell transistors.

Also, by the ferroelectric process using an ink jet type recording head, a lithography step can be omitted, with the result that the manufacturing process is simplified and the manufacturing cost is lowered.

Furthermore, since the present invention provides a structure in which partition members are provided to partition memory cells, cross talks between the adjacent memory cells, which accompany with a higher memory device integration, can be effectively prevented. Therefore, higher memory device integration becomes possible.

What is claimed is:

1. A method for forming a non-volatile memory device, comprising:

forming first electrodes separated from one another by barrier members;

depositing an organic thin film solution on the first electrodes and solidifying at least a portion of the organic thin film solution to form a thin film, wherein the thin film is capable of a polarization inversion by exposure to an electric field;

wherein the barrier members are formed to include a first insulating layer and a second layer that repels the organic thin film solution; and forming a second electrode on the thin film on the first electrodes.

2. A method as in claim 1, comprising forming the second electrode as a continuous layer on the barrier members and on the thin film.

3. A method as in claim 1, wherein the barrier members separate the thin film into separate dielectric regions on separate first electrodes.

4. A method as in claim 3, comprising forming the thin film to have a curved surface, wherein a central portion of the thin film on the first electrode has a greater thickness than side portions of the thin film on the first electrode, and forming the second electrode in contact with the curved surface.

5. A method as in claim 1, wherein the non-volatile memory device includes transistors, the transistors including drain regions therein, and the first electrodes are formed to be in contact with the drain regions.

6. A method for manufacturing a semiconductor device having a ferroelectric capacitor that is provided between a lower electrode and an upper electrode, the method for manufacturing a semiconductor device comprising the steps of;

providing a semiconductor substrate including a transistor, forming an insulation layer overlying the transistor, forming a lower electrode over the insulation layer, wherein the lower electrode is in electrical contact with a part of the transistor, forming partitioning members over the insulation layer, the partitioning members adapted to separate the lower electrode from other lower electrodes, and depositing a solution for forming an organic layer over the lower electrode that is partitioned from other lower electrodes by the partitioning members, wherein the organic layer is not deposited directly above the partitioning members, and thereafter solidifying the same to form the organic layer.

7. A method for manufacturing a semiconductor device as set forth in claim 6, wherein no portion of the organic layer is removed after its formation.

8. A method for manufacturing a semiconductor device as set forth in claim 6, wherein the partitioning members include an upper layer that is formed from a material having a non-affinity for the material solution for the organic thin film.

9. A method for manufacturing a semiconductor device as set forth in claim 8, wherein the material having a non-affinity is selected from a group consisting of polyimide, amorphous silicon, polysilicon and an organic compound including fluorine.

10. A method for manufacturing a semiconductor device as set forth in claim 6, wherein a material solution containing a copolymer of vinylidene fluoride and trifluoroethylene dissolved in a solvent is used as the material solution for the organic thin film.

11. A method for manufacturing a semiconductor device as set forth in claim 6, wherein the material solution for the organic thin film is coated over the lower electrode by using an ink jet type recording head.

12. A method for manufacturing a semiconductor device as in claim 6, wherein a material solution containing fine particles of the upper electrode is coated over the organic thin film and solidified to thereby form the upper electrode.

13. A method for manufacturing a semiconductor device as set forth in claim 12, wherein the material solution containing fine particles of the upper electrode is coated over the organic thin film by using an ink jet type recording head.

14. A method for manufacturing a semiconductor device having a ferroelectric capacitor that is provided between a lower electrode and an upper electrode, the method for manufacturing a semiconductor device comprising the steps of:

providing a semiconductor substrate including a transistor, forming an insulation layer overlying the transistor, forming a lower electrode over the insulation layer, wherein the lower electrode is in electrical contact with a part of the transistor, forming partitioning members over the insulation layer, the partitioning members adapted to separate the lower electrode from other lower electrodes, coating a solution for forming an organic layer on the lower electrode, and solidifying the same to form the organic layer, wherein the solution for the organic layer is coated over the lower electrode by using an ink jet type recording head;

and wherein after the organic layer is coated over the lower electrode, the solution is positioned between the partitioning members and not directly above an upper surface of the partitioning members.

15. A method for manufacturing a semiconductor device as set forth in claim 14, wherein a material solution containing fine particles of the upper electrode is coated over the organic thin film and solidified to thereby form the upper electrode.

16. A method for manufacturing a semiconductor device having a ferroelectric capacitor that is provided between a lower electrode and an upper electrode, the method for manufacturing a semiconductor device comprising:

providing a semiconductor substrate including a transistor, forming an insulation layer overlying the transistor, forming a lower electrode over the insulation layer, wherein the lower electrode is in electrical contact with a part of the transistor, forming partitioning members over the insulation layer, the partitioning members adapted to separate the lower electrode from other lower electrodes, coating a solution for forming an organic layer on the lower electrode so that the solution is not positioned directly above the partitioning members, and solidifying the same to form the organic layer, wherein a solution containing fine particles of the upper electrode is coated over the organic layer and solidified to thereby form the upper electrode.

17. A method as in claim 16, wherein the coating a solution for forming an organic layer comprises depositing the solution over the lower electrode and between the partitioning members and then solidifying the solution, wherein no portion of the organic layer is removed after the solidifying the solution.

18. A method for manufacturing a non-volatile memory device including a ferroelectric capacitor, comprising:

providing a semiconductor device including a plurality of transistors, forming an insulation layer overlying the transistors, forming a plurality of lower electrodes separated from one another over the insulation layer, wherein the lower electrodes have electrical contacts with part of the transistors, forming partitioning members over the insulating layer, applying a solution to form an organic layer on the lower electrodes between the partitioning members, wherein after the solution is applied, the solution is only positioned in a region between the partitioning members;

solidifying at least part of the applied solution to form the organic layer, and forming an upper electrode over the organic layer.

19. A method as in claim 18, wherein no portion of the organic layer is removed after its formation and prior to forming the upper electrode layer.

20. A method for manufacturing a non-volatile memory device as in claim 18, wherein forming the upper electrode comprises depositing an upper electrode solution over the thin film and solidifying at least a portion of the upper electrode solution.

21. A method for manufacturing a non-volatile memory device as in claim 18, wherein the partitioning members are formed between the lower electrodes and the applying a solution to form an organic layer on the lower electrodes is carried out in a manner so that so that the solution does not extend in a continuous manner from one lower electrode to another lower electrode.

22. A method for manufacturing a non-volatile memory device as in claim 21, wherein the solution to form an organic layer is deposited using an ink-jet type recording head.

23. A method as in claim 21, wherein the partitioning members include a first insulating layer and a second layer that repels the solution.

24. A method as in claim 23, wherein the second layer comprises a material selected from the group consisting of polyimide, amorphous silicon, polysilicon, and an organic compound including fluorine.

25. A method as in claim 18, wherein the solidifying is carried out at a temperature of no greater than 200° C.

26. A method as in claim 18, wherein the applying a solution to form an organic layer comprises depositing the solution over the lower electrode and between the partitioning members.

27. A method as in claim 18, comprising forming the organic layer to have a curved surface, wherein a central portion of the organic layer over the first electrode has a greater thickness than side portions of the organic layer over the first electrode, and forming the second electrode in contact with the curved surface.

28. A method for manufacturing a semiconductor device comprising:

providing a semiconductor substrate including a transistor, forming an insulation layer overlying the transistor, forming a lower electrode over the insulation layer, wherein the lower electrode is in electrical contact with a part of the transistor, forming partitioning members over the insulation layer that separate the lower electrode from other lower electrodes, applying a solution for forming an organic layer on the lower electrode so that after the solution is applied, the solution is positioned between the partitioning members and not above the partitioning members, solidifying at least a portion of the solution for forming an organic layer, and forming an upper electrode after the solidifying at least a portion of the solution for forming an organic layer, wherein said forming an upper electrode comprises applying a solution for forming an upper electrode and solidifying at least a portion of the solution for forming an upper electrode.

29. A method for manufacturing a semiconductor device comprising:

providing a semiconductor substrate including a transistor, forming an insulation layer overlying the transistor, forming a lower electrode over the insulation layer, wherein the lower electrode is in electrical contact with a part of the transistor, forming partitioning members over the insulation layer, applying a solution to form an organic layer on the lower electrode and between side surfaces of the partitioning members, so that no portion of the solution is positioned above the partitioning members, and solidifying at least a portion of the solution to form an organic layer so that the organic layer is formed, forming an upper electrode on the organic layer, and forming a plurality of additional lower electrodes, wherein the lower electrodes are electrically isolated from each other, and applying the solution for forming the organic layer on the additional lower electrodes.

30. A method for forming a semiconductor device, comprising:

providing a semiconductor substrate including a plurality of transistors, forming an insulation layer overlying the transistors, forming lower electrodes over the insulation layer to be separated from one another by partitioning members, wherein the lower electrodes are in electrical contact with part of the transistors, forming partitioning members over the insulation layer, applying a solution for forming an organic layer on the first electrodes and solidifying at least a portion of the applied solution to form an organic layer, wherein the partitioning members are formed to include a first insulating layer and a second insulating layer that repels the solution, and forming a second electrode on the organic layer on the first electrodes.

31. A method as in claim 30, wherein the second insulating layer comprises a material selected from the group consisting of polyimide, amorphous silicon, polysilicon, and an organic compound including fluorine.

32. A method as in claim 30, wherein the partitioning members separate the thin film into separate dielectric regions on separate first electrodes, and wherein the second electrode is formed as a continuous layer on the partitioning members and on the organic layer.

33. A method as in claim 30, wherein the part of the transistors that the lower electrodes are in electrical contact with comprises drain regions.

34. A method for forming a semiconductor device, comprising:

forming a plurality of cells each including a transistor therein, the cells also each including a first capacitor electrode therein, the first capacitor electrodes being formed over an insulating layer, the first capacitor electrodes in adjacent cells being separated from each other, forming partitioning members over the insulation layer that separate the cells from one another, applying a solution for forming an organic layer on the first capacitor electrodes between the partitioning members, so that the solution is only positioned in a region between the partitioning members, and solidifying at least a portion of the applied solution to form an organic layer, and forming a continuous second capacitor electrode on the organic layer, the second capacitor electrode layer formed to be a common electrode for the cells.

35. A method as in claim 34, wherein no portion of the organic layer is removed after its formation and prior to forming the continuous second capacitor electrode.

36. A method as in claim 34, wherein the organic layer is capable of a polarization inversion by exposure to an electric field.

* * * * *